TRANSISTOR OSCILLATORY CONTROL CIRCUIT

Filed Oct. 27, 1955

INVENTOR
THEODORE A. HANSEN

BY Emery Robinson
ATTORNEY

United States Patent Office 2,912,654
Patented Nov. 10, 1959

2,912,654

TRANSISTOR OSCILLATORY CONTROL CIRCUIT

Theodore A. Hansen, Park Ridge, Ill., assignor to Teletype Corporation, Chicago, Ill., a corporation of Delaware Application October 27, 1955, Serial No. 543,061

11 Claims. (Cl. 331—117)

This invention pertains to transistor oscillatory control circuits and more particularly to transistor controlled circuits for regulating the amplitude of oscillation of oscillatory currents.

In a variety of electric circuits such as transmitting and receiving radio circuits, there is a need for a control circuit that can readily and efficiently maintain within prescribed limits the amplitude and frequency of oscillation of oscillatory currents. Even where crystal controlled oscillators have been used to obtain stability of oscillation, it has been found that the frequency of the crystal control unit is to a degree a function of the amplitude of the applied or input current. As the crystal control unit has applied thereto currents exceeding a predetermined amplitude, the frequency of the circuit changes and will not return to its original rate when the applied current is restored to its original value. As a result, great care must be exercised to hold the currents applied to crystal oscillators at a constant low value.

Recently, current regulating and amplifying devices termed transistors have been developed; for example, see the patents to W. Shockley, No. 2,569,347, granted September 25, 1951, and to J. Bardeen et al., No. 2,524,035, granted October 3, 1950. It is true that these devices have been used in the design of several oscillatory circuits and as control elements for amplifying alternating currents, however, there are still unsatisfied requisites for regulating the output oscillations or alterations of said transistor circuits to be within precise increments of amplitude.

It is a primary object of this invention to provide a simple, stable and precise circuit for regulating the amplitude of oscillation of an oscillatory current device.

Another object of the invention resides in an impedance circuit having variable parameters for controlling the input to an oscillatory device in accordance with the output of said device.

An additional object of the invention is the provision of a simple transistor control device having a varistor shunt circuit regulated by the amplitude of the oscillatory output current.

A more finite object of the invention is to provide a crystal controlled oscillator having two feedback circuits for holding stable both the amplitude and frequency of the output circuit.

A further finite object of the invention resides in a transistor controlled circuit for amplifying an oscillatory input current by means of varying the impedance of a shunt circuit in accordance with the magnitude of the amplified oscillatory output current.

With these and other objects in view, the present invention contemplates in one embodiment a crystal oscillator including a two stage transistor amplifier wherein each transistor has a base electrode, an emitter electrode and a collector electrode. The crystal utilized is in the form of a piezo electric crystal device which is connected through suitable circuit elements to the emitter electrode of the second transistor. A resonant circuit is connected to the collector electrode of the first transistor and is also connected to a source of energy for operating the transistor. This resonant circuit has a resonant frequency that is approximately equal to the resonant frequency of the crystal. A positive feed-back circuit runs from the crystal to the emitter electrode of the first transistor to make oscillation possible. A variable impedance A.C. circuit is connected in shunt relationship to the feed-back circuit for the purpose of controlling the amount of feed-back applied to the transistor to sustain oscillation.

The variable impedance circuit includes a germanium varistor that has a well-known, nonlinear resistive characteristic. The resistive value of the varistor in the shunt impedance circuit is determined by a second feed-back circuit that includes elements for rectifying portions of the output oscillator current. The magnitude of the current applied to this second feed-back circuit varies directly as the maximum amplitude of oscillation of the output current. As the feed-back current varies, the conductivity and the resistance of the varistor also varies, thereby varying the total impedance of the shunt circuit to regulate the amount of feed-back current being applied to the transistor. As a result thereof, the amplitude of the oscillatory output current is maintained at a constant value.

Other objects and advantages of the invention will be apparent from the following detailed description when considered in conjunction with the accompanying drawings, wherein.

Figure 1:
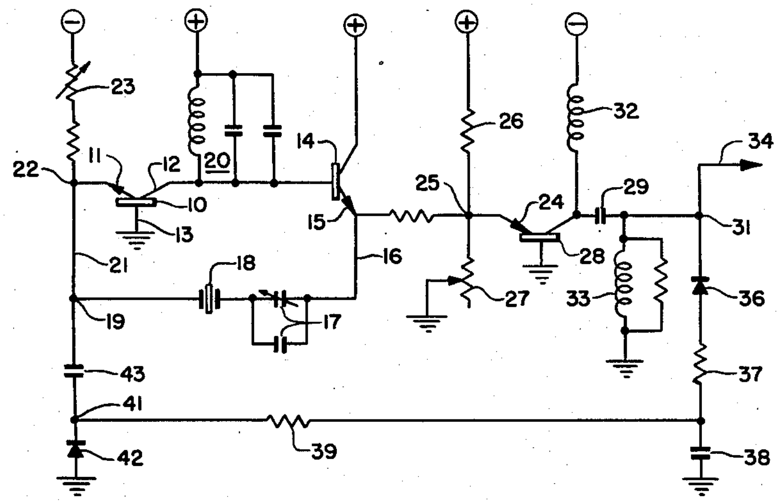
Fig. 1 is a circuit diagram illustrating a crystal controlled oscillator embodying the principal features of the present invention.

Referring to Fig. 1, there is shown an NPN-type junction transistor 10 having an emitter 11, a collector 12 and a grounded base 13. The collector 12 is connected to the base of a second NPN-type junction transistor 14 which has an emitter 15 connected over a lead 16 and through a capacitance circuit 17 to one face of a quartz crystal 18. The opposite face of the crystal is connected through a junction point 19, a lead 21 and a junction point 22 to the emitter 11. Crystal 18 is cut to have a selected resonant frequency. The capacitance circuit 17 is provided for the purpose of precisely adjusting the resonant frequency of the crystal.

The collector 12 of the transistor 10 is also connected to a tuning circuit, generally designated by the reference numeral 20. This circuit is tuned to match the resonant frequency of the crystal 18 and can be temperature compensated by the utilization of a negative-coefficient type of ceramic capacitance. This tuned circuit is also connected to a source of positive battery and provides a high impedance load for the collector 12.

A variable resistance 23 connects the emitter 11 with a source of negative potential. It is possible to adjust the resistance 23 and thereby control the output of the collector 12. The circuit thus described, when connected to suitable potential sources will function as an oscillator because the energy fed back to the emitter is more than the energy lost in the quartz crystal.

An output from the transistor 14 is taken from its emitter and impressed on an emitter 24 to vary the emitter current at this point in proportion to the oscillating output of the transistor 14. Junction point 25 is located between a pair of resistances 26 and 27 that form a voltage divider for impressing a bias on the emitter 24 and varying the gain of an PNP-type junction transistor 28 asociated therewith. Transistor 28 functions as a further amplifier, and an output therefrom is impressed through a capacitance 29 to a junction point 31. The output circuit of the transistor 28 is a pi network consisting of the capacitance 29 and a pair of inductances 32 and 33. Values are selected for the components of the pi network to provide an impedance which will match the collector impedance of the transmitter 28 to the impedance of the load elements connected to the junction point 31. The oscillating current impressed on junction point 31 has its positive excursions impressed over an output lead 34 which may be connected to any desired utilization device.

The negative portions of the oscillations impressed on junction point 31 render a diode 36 conductive. Diode 36 acts as a half-wave rectifier for the negative oscillatory current. The pulsations in the rectified current are removed by a filter circuit consisting of a resistance 37 and a capacitance 38. This rectified negative current causes current to flow through a resistance 39 to develop biasing potential at a junction point 41, that controls the conductivity of a germanium varistor 42. It may be thus appreciated that, as the heretofore-described circuit produces oscillations of increasing magnitude, the rectified negative current also increases to drive the point 41 more negative and to drive the varistor 42 into a greater state of conduction. Junction point 41 is also connected through a capacitance 43 to the junction point 19. The capacitative reactance of condenser 43 and the resistance of varistor 42 determine the impedance value of an A.C. shunt circuit connected to the junction point 19. It may be thus understood that the feed-back current impressed through the crystal 18 to the junction point 19 is not all applied back to the emitter 11, but rather a portion thereof is shunted by the impedance circuit 43—42. The amount of current passed to the shunt circuit may be regulated by adjusting the resistance 23. If the resistance 23 is adjusted to present a very high resistance, then the portion of the feed-back current impressed through the shunt circuit will be so great as to preclude further sustaining of the oscillation of the circuit.

Figure 2:
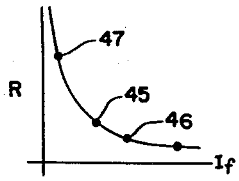
Fig. 2 is a resistance-current forward characteristic curve of a typical germanium diode.

Referring to Fig. 2, there is shown a characteristic curve of the feed-back current $I_f$ applied to the junction point 41 vs. the resistance value of the varistor 42. Now, if the value of resistance 23 is adjusted so that the output current equals a value wherein the feed-back current $I_f$ operates at a point 45 on the curve, then only a relatively small portion of the A.C. feed-back current applied to junction point 19 will be diverted to the shunting impedance circuit. The remainder of the A.C. current applied to the junction point 19 will be applied to the emitter 11 to sustain oscillation of the circuit.

If, for some reason or other, the output current of the circuit exceeds the critical value, then the feed-back current $I_f$ applied to junction point 41 increases, and, as a consequence, the varistor 42 is driven into a heavier state of conduction. In this instance, the operating point on the characteristic curve shown in Fig. 2 moves to position 46, and it is apparent that under this condition, the varistor 42 offers a smaller resistance in the shunting impedance circuit. The net result of this action is that the impedance of the shunt circuit decreases, and more of the A.C. feed-back current applied to the junction point 19 is diverted to the now-low-impedance shunt circuit, thereby decreasing the feed-back current applied to the emitter 11. Since the output is proportional to the emitter current, the input to the transistor 10 is reduced to cause the amplitude of the oscillatory output current to restore to its former value.

In a converse manner, when the oscillatory output current decreases in amplitude, there is less current feed-back to junction point 41. As a consequence thereof, the conductivity of the varistor 42 is decreased, and its resistance value in the impedance shunt circuit increases. The operating point for the varistor is now represented by the reference numeral 47 in Fig. 2. With an increase in the impedance value of the shunt circuit, more feed-back current passing through junction point 19 is supplied to the emitter 11. Obviously, with more oscillatory feed-back current available at emitter 11, the transistor 10 is driven into higher states of conductivity, thereby causing the magnitude of the oscillatory output current to increase to the desired amplitude.

Figure 3:
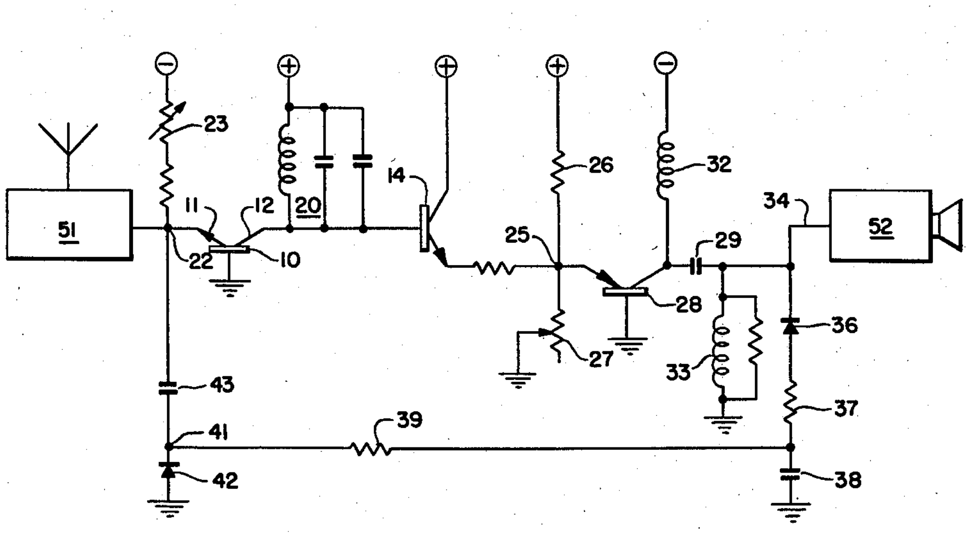
Fig. 3 is a circuit diagram showing another embodiment of the invention wherein the gain in an amplifier is maintained constant.

Attention is now directed to Fig. 3, wherein the invention is applied to an alternating current gain control circuit. In Fig. 3, wherever elements are identical to those shown in Fig. 1, identical reference numerals are used. It will be immediately noticed that the feed-back from the transistor 14 is no longer provided. Consequently, this circuit is incapable of sustaining oscillation without application of energy from an external source. In this instance, the external source is taken as a superheterodyne receiving unit 51. In addition, the output lead 34 is connected to an audio detector 52 of a radio sound-reproducing set.

In operation of this circuit, it is again desired to maintain constant the amplitude of the oscillatory current impressed on the output lead 34. The input intermediate-frequency current from the unit 51 is applied to the junction point 22, and as long as it is maintained at a constant value and the circuit output is at a constant value, the varistor 42 will again operate at point 45 on the characteristic curve shown in Fig. 2.

If, however, the amplitude of the intermediate-frequency current should suddenly increase, the amount of feed-back current applied to the junction point 41 would likewise increase, thereby driving the varistor 42 into a heavier state of conduction. The effective resistance of the varistor 42 in the shunt impedance circuit connected to junction point 22 is thereby decreased, causing an increased amount of the incoming intermediate-frequency current to be diverted to the now-low-impedance shunt circuit. Obviously, therefore, there is less current applied to the emitter 11, and, as a consequence, the output of the amplifying circuit is decreased to restore the output on lead 34 to the desired value.

Conversely, if the amplitude of the intermediate-frequency current should drop, then the peak values of the output current impressed on the output lead 34 and the feed-back current applied to junction point 41 will decrease. With less feed-back current available at junction point 41, the conductivity of varistor 42 decreases, and the varistor offers a greater resistance value in the shunting impedance circuit. Less of the incoming intermediate-frequency current will be diverted to the impedance circuit so that the transistor 10 will be driven into greater states of conduction to again effectuate a restoration of the amplitude of feed-back oscillatory current impressed on the lead 34.

It is to be understood that the above-described embodiments, arrangements of circuit components and construction of elemental parts are simply illustrative of an application of the principles of the invention, and many other modifications may be made without departing from the invention.

What is claimed is:

1. In a circuit having an oscillatory output, a transistor having a base, an emitter and a collector, circuit means for applying an oscillatory input to said emitter, a variable impedance circuit connected in shunt relationship to said input circuit means, and rectifier means connected to said collector for controlling the variable impedance circuit in accordance with the amplitude of the output current at the collector.

2. In a circuit for producing an oscillatory output current, a transistor having a base electrode, an emitter electrode, and a collector electrode, potential means connected to said electrodes to cause the transistor to operate as a current gain device, an input circuit for applying an oscillatory current to said emitter, an alternating current shunt circuit connected to said emitter, a varistor having a variable resistance characteristic connected in said shunt circuit, and a direct current control circuit for said varistor connected to said collector.

3. In an oscillator, a transistor having an emitter, a collector and a grounded base, a first feed-back circuit running from the collector to the emitter, a shunt circuit including a nonlinear varistor connected to said first feed-back circuit, a rectifying feed-back circuit connected to said collector for controlling the conductivity of the varistor, and a source of energy connected to said emitter, base, and collector for operating said transistor as an oscillator.

4. An oscillator comprising a transistor having a grounded base, an emitter and a collector, a crystal, a feed-back circuit including said crystal interconnecting the collector and emitter, energy means connected to said emitter and collector to cause said transistor to produce an oscillatory output, a shunt circuit connected to said feed-back circuit, a nonlinear resistance element in said shunt circuit, and a second feed-back circuit for controlling the resistance value of said resistance element.

5. In an oscillator, a transistor having an emitter, a collector and a base, a crystal feed-back circuit running from the collector to the emitter, means for applying biasing potential to said emitter, collector and base to cause said circuit to operate as an oscillator, a second feed-back circuit running from said collector to said first feed-back circuit, a rectifier connected in said second circuit and a varistor having nonlinear resistance characteristics connected to said second circuit, and a capacitance connected in said second feed-back circuit between said varistor and said first feed-back circuit to provide an alternating current shunt circuit for said first feed-back circuit.

6. An oscillator comprising a transistor having a grounded base, a collector and an emitter, a first feed-back circuit interconnecting said collector and emitter, energy means connected to said emitter and collector for causing said transistor to produce an oscillatory output, an alternating current shunt circuit connected to said first feed-back circuit and having therein a variable impedance element, a second feed-back circuit connected to said collector for controlling the impedance of the shunt circuit, and means connected to said emitter for controlling the proportion of feed-back current applied to the emitter.

7. In an oscillatory circuit, a transistor having an emitter, a base and a collector, a crystal, means interconnecting said crystal between said collector and emitter to provide a feed-back circuit, means for applying operating potentials to said emitter, base and collector to cause said transistor to produce an oscillatory output, a capacitance and varistor connected to said feed-back circuit to provide an alternating current shunt circuit, a second feed-back circuit for applying said output of said transistor to said varistor to vary the conductivity of the varistor to regulate the first feed-back circuit, and an adjustable resistance connected to the emitter for controlling the amount of feed-back current diverted to said capacitance-varistor shunt circuit.

8. An amplifier circuit comprising a transistor having a grounded base, an emitter and a collector, an external source of oscillating current connected to said emitter, a shunt circuit connected to said emitter, a variable impedance element connected in said shunt circuit, and a feed-back circuit connecting said collector and said variable impedance element to control the effective impedance of said element in accordance with the amplitude of the output current at the collector.

9. In a circuit for regulating the amplitude of output current from a transistor, said transistor having an emitter, a collector and a base, an alternating current shunt circuit connected to said emitter, a varistor having variable resistance characteristics included in said shunt circuit, means for rectifying and applying a portion of the output current from the collector to regulate the conductivity of the varistor, and means for applying an oscillating input current to said emitter.

10. In a circuit for regulating the gain in amplitude of an oscillatory current in a transistor, said transistor having an emitter electrode, a collector electrode and a base electrode, means for connecting energy to said electrodes to operate said transistor as an amplifier, a rectifier circuit connected to said collector electrode, a varistor having nonlinear resistance characteristics, means connecting the varistor to said rectifier circuit whereby the conductivity of the varistor varies in accordance with the magnitude of the rectified current, means for applying an oscillatory input current to said emitter, and a shunt circuit including a condenser and said varistor connected to said emitter.

11. In an automatic gain control circuit, a transistor having an emitter, a collector and a base, a feed-back circuit running from said collector to said emitter, a rectifier and filter means in said feed-back circuit, a capacitance included in said feed-back circuit to provide isolation between said emitter and said rectifier and filter means, a varistor connected to said feed-back circuit between said capacitance and said rectifier and filter means, said varistor being poled for conduction toward said feed-back circuit and having a nonlinear resistance characteristic, means for applying alternating input current to said emitter whereby a portion of said current is diverted from said collector to said emitter in accordance with the conductivity of the varistor.

References Cited in the file of this patent

UNITED STATES PATENTS

| | | |
|---|---|---|
| 2,724,777 | Brock | Nov. 22, 1955 |
| 2,751,446 | Bopp | June 19, 1956 |
| 2,760,070 | Keonjian | Aug. 21, 1956 |
| 2,764,643 | Sulzer | Sept. 25, 1956 |
| 2,789,164 | Stanley | Apr. 16, 1957 |

OTHER REFERENCES

Article: "Transistor Broadcast Receivers," by Stern et al., pages 1107–12 of Electrical Engineering for December 1954.

Article: "Automatic Gain Control of Transistor Amplifiers," by Chow et al., pages 1119–27 of P.I.R.E. for September 1955, 179–171 MB, originally presented February 17, 1955.